United States Patent
Scheurich et al.

(10) Patent No.: US 6,871,546 B2
(45) Date of Patent: Mar. 29, 2005

(54) PRESSURE SENSOR MODULE WITH SENSOR CELL AND ADAPTER

(75) Inventors: Heiko Scheurich, Stuttgart (DE); Martin Mast, Gerlingen (DE); Berthold Rogge, Stuttgart (DE); Masoud Habibi, Schwieberdingen (DE)

(73) Assignee: Robert Bosch GmbH, Stuttgart (DE)

(*) Notice: Subject to any disclaimer, the term of this patent is extended or adjusted under 35 U.S.C. 154(b) by 39 days.

(21) Appl. No.: 10/257,894

(22) PCT Filed: Feb. 14, 2002

(86) PCT No.: PCT/DE02/00519

§ 371 (c)(1),
(2), (4) Date: Feb. 7, 2003

(87) PCT Pub. No.: WO02/066948

PCT Pub. Date: Aug. 29, 2002

(65) Prior Publication Data

US 2003/0151126 A1 Aug. 14, 2003

(30) Foreign Application Priority Data

Feb. 20, 2001 (DE) .......................... 101 07 813

(51) Int. Cl.⁷ ................................. G01L 9/16
(52) U.S. Cl. ..................... 73/754; 73/756; 73/725; 73/715
(58) Field of Search ............... 73/756, 725, 715

(56) References Cited

U.S. PATENT DOCUMENTS

| | | | |
|---|---|---|---|
| 4,970,898 A | | 11/1990 | Walish et al. |
| 5,222,397 A | * | 6/1993 | Kodama ...................... 73/756 |
| 5,595,939 A | | 1/1997 | Otake et al. |
| 5,625,151 A | | 4/1997 | Yamaguchi |
| 5,629,538 A | | 5/1997 | Lipphardt et al. |
| 5,665,921 A | * | 9/1997 | Gerst et al. .................. 73/715 |
| 5,765,436 A | | 6/1998 | Wilda et al. |
| 5,792,958 A | | 8/1998 | Speldrich |
| 6,050,146 A | * | 4/2000 | Nakamura et al. ............ 73/725 |
| 2002/0062696 A1 | * | 5/2002 | Burczyk et al. .............. 73/715 |
| 2003/0127850 A1 | * | 7/2003 | Bischoff et al. ............. 285/93 |

FOREIGN PATENT DOCUMENTS

| | | |
|---|---|---|
| DE | 42 05 264 A1 | 8/1993 |
| DE | 195 07 143 A1 | 9/1995 |
| DE | 44 15 984 A1 | 11/1995 |
| DE | 196 12 964 A1 | 10/1997 |
| DE | 199 19 112 A1 | 11/2000 |

OTHER PUBLICATIONS

Patent Abstracts of Japan vol. 1999, No. 009 Jul. 30, 1999 & JP 11 108787 A, Apr. 23, 1999.
Patent Abstracts of Japan JP 08136380 A, May 31,1996.
Patent abstract of Japan 2000046666A, Feb 18, 2000.
AMA–Seminar Mikromechanik, Heildelberg Penta Hotel, Mar. 14–15, 1989, pp. 285–295.
Patent Abstracts of Japan 200009568 A, Jan. 14, 2000.
Patent Abstracts of Japan 200009568 A, Jan. 14, 2000.
Patent Abstracts of Japan 200009568 A, Jan. 14, 2000.
Patent Abstracts of Japan 113161666 A, Nov. 16, 1999.

* cited by examiner

*Primary Examiner*—Edward Lefkowitz
*Assistant Examiner*—Andre Allen
(74) *Attorney, Agent, or Firm*—Michael J. Striker

(57) ABSTRACT

In a pressure sensor module according to the prior art, which is intended for detecting the pressure of a corrosive medium, the conventional sensor cell with a pressure sensor chip is modified in order to protect it from corrosion, which results in a large volume for a pressure-transmitting-fluid. This is disadvantageous for the calibration and for a high degree of measurement precision.

In a pressure sensor module (1) according to the invention, a convention sensor cell (5) is used that has an adapter (21) connected to it, which has a very small volume for a pressure-transmitting medium.

13 Claims, 8 Drawing Sheets

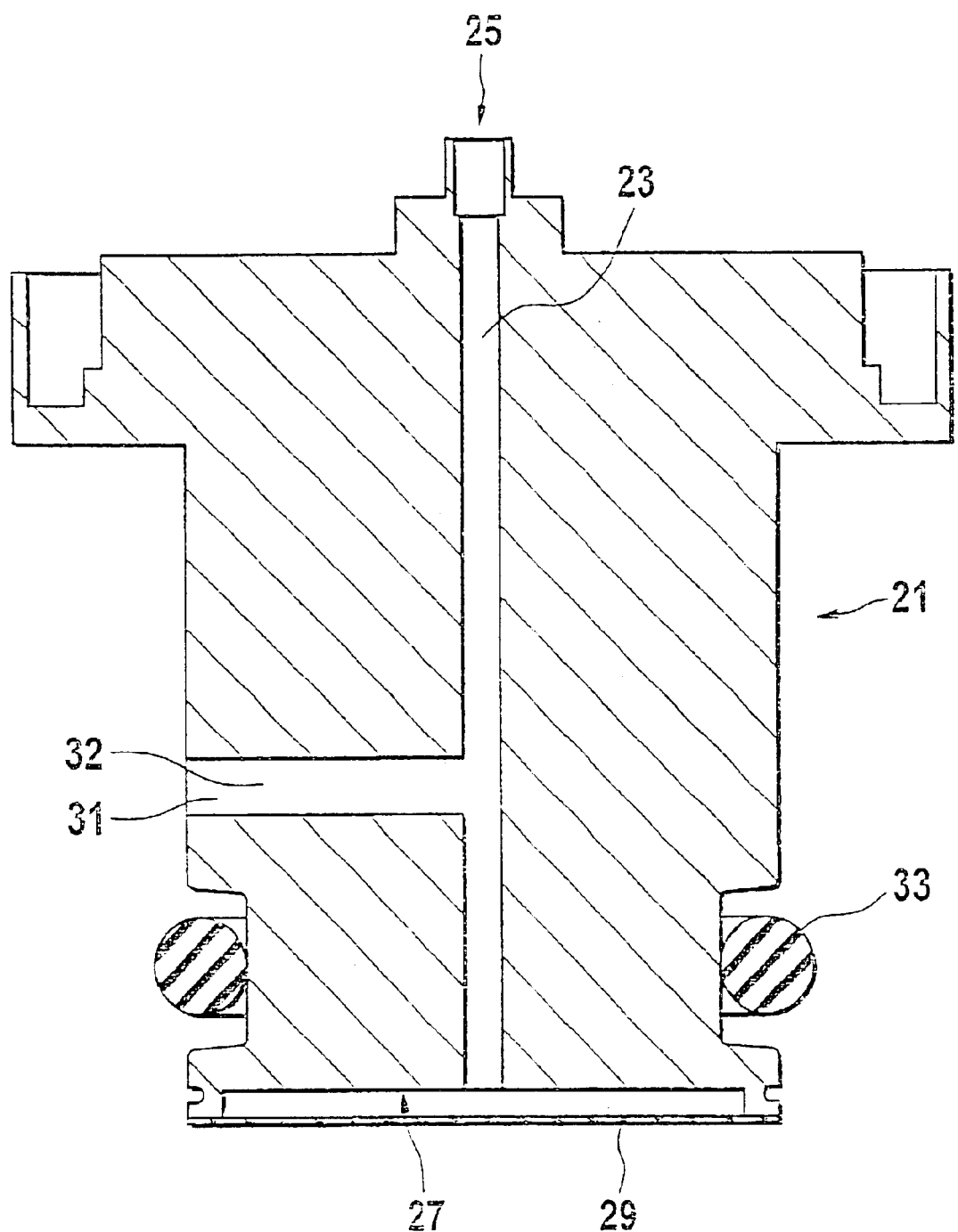

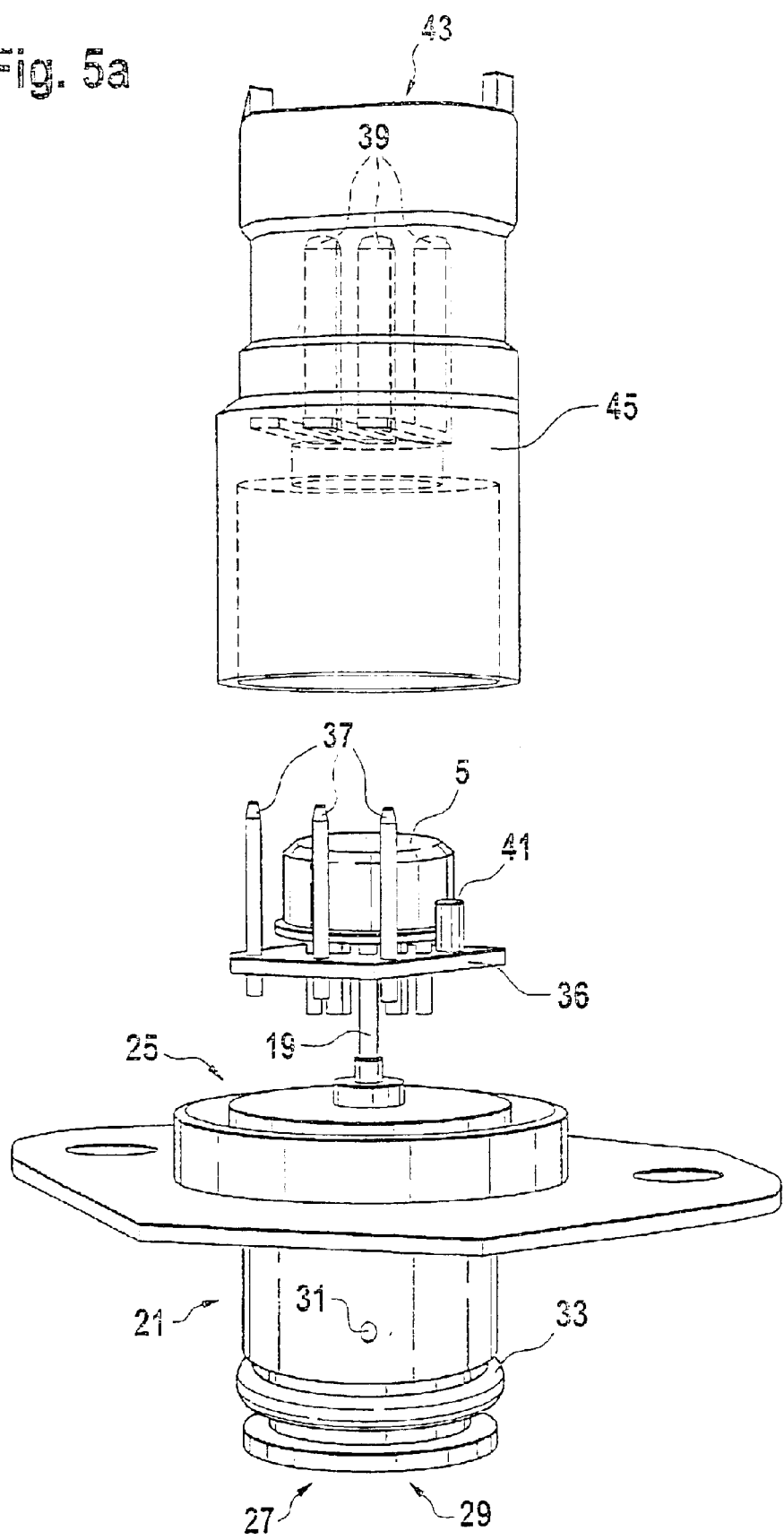

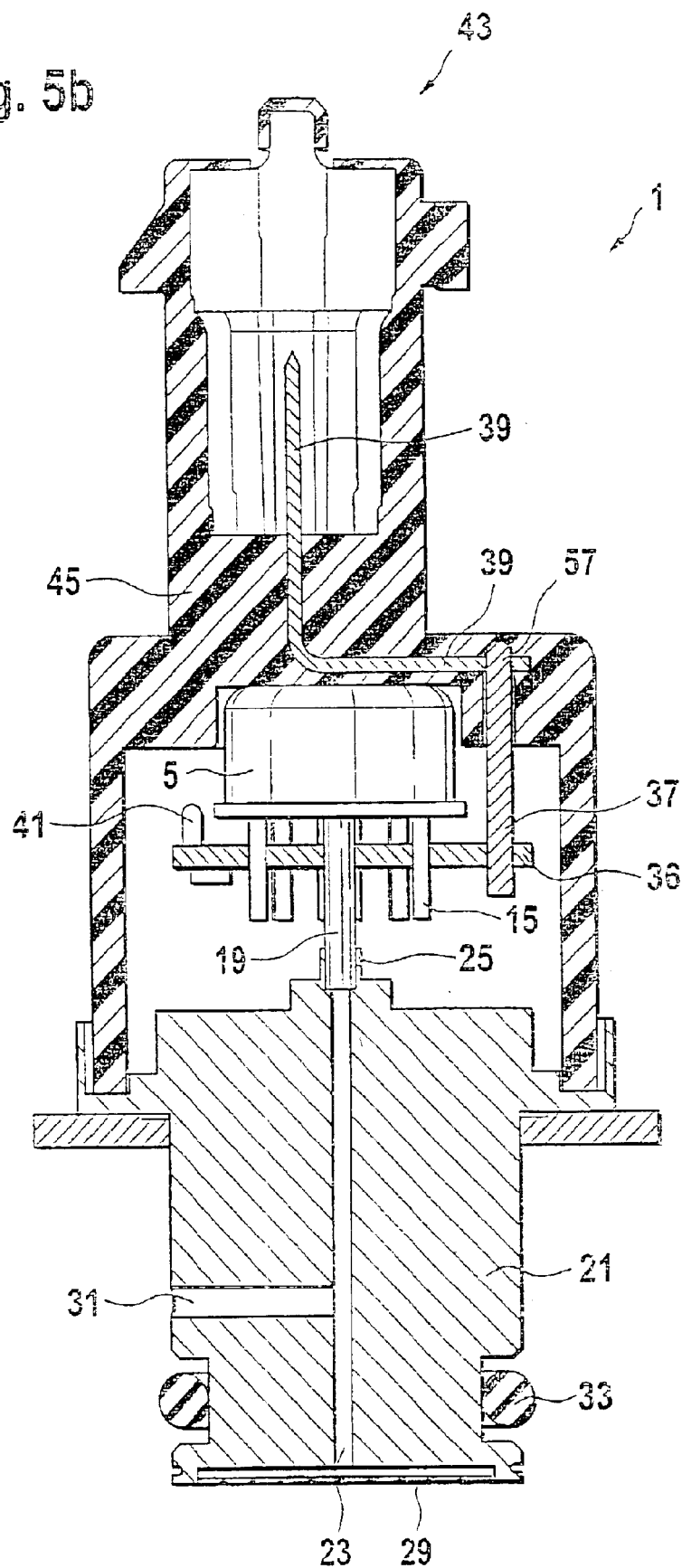

Fig. 6

PRESSURE SENSOR MODULE WITH SENSOR CELL AND ADAPTER

BACKGROUND OF THE INVENTION

A pressure sensor module contains, for example, piezoresistive sensor cells, which are used for a broad range of applications, for example a pressure measurement in an intake manifold of a motor vehicle. In this connection, a pressure sensor chip is soldered to a socket, which has glass feedthroughs for external electrical connections. Then electrical connections of the pressure sensor chip are electrically contacted with the external electrical connections by means of bonding wires.

The pressure of a medium acts, for example, on a back side of the pressure sensor chip by means of a metal tube, which is soldered to the socket. For absolute pressure measurements, a metal cap is welded to the socket under vacuum. For relative pressure measurements, the cap has an opening. The pressure sensor chip is protected, for example by means of a gel, against external influences. A sensor cell of this kind cannot be used with intensely corrosive mediums since the corrosive medium corrodes the sensor chip or the gel.

JP 2000 046 666 A1 has disclosed a pressure sensor module in which the sensor membrane is protected by a gel in the pressure fitting. However, this gel is also corroded by the corrosive medium and since as a gel, it does not have great chemical resistance or mechanical strength, it changes in shape over time, which has an influence on the measuring results.

To this end, according to the prior art, the pressure is indirectly transmitted to the pressure sensor chip by means of a separating membrane and a pressure transmitting medium, e.g. silicon oil. The design of such a pressure sensor module, with this oil seal is known, for example, from the AMA seminar tape, 1989, pp. 285 to 295. In this design, the oil volume around the pressure sensor chip is relatively large. Due to the high thermal volume expansion coefficient of the silicon oil in comparison to the volume expansion coefficient of a housing material, the separating membrane is deflected in the event of a temperature change. Due to a non-negligible rigidity of the separating membrane, a pressure then builds up on the pressure sensor chip in the pressure sensor module, which is due solely to the temperature change and distorts the measurement signal.

In order to reduce the oil volume in the known pressure sensor module, the oil volume around the pressure sensor chip is reduced, e.g. by means of a filling body made of ceramic. In this instance, the filling body requires a separate assembly step. In the known pressure sensor module, due to the relatively high manufacturing tolerances, there is a large oil volume for the cavity around the pressure sensor chip in comparison to the cavity underneath the separating membrane.

As a result, for greater measurement precision, it is necessary to calibrate the pressure sensor chip when it is filled with oil. In this connection, the amount of time required to complete the temperature steps during calibration is longer since there is a higher heat capacity. In addition, in the known pressure sensor module, a defect of the pressure sensor chip can only be detected once it is completely assembled. As a result, the costs arising from rejections are higher since the finished component has to be discarded.

DE 195 07 143 A1 and U.S. Pat. No. 5,595,939 have disclosed a pressure sensor module according to the principal of the oil seal, with a simpler assembly process. In this pressure sensor module, the filling body for reducing the oil volume is replaced by a recess for the pressure sensor chip in the plastic plug connector housing. In this instance, a sealing of the separating membrane in relation to the plug connector is produced by means of an O-ring or a crimped seal. With this type of seal, there is the danger, for example in the event of a damaged O-ring or when particles adhere to the sealing surface, of oil escaping from the interior of the sensor. In the pressure sensor module, when the module is being filled with oil, the exertion of a high pressure on the separating membrane forces the residual air enclosed in the sensor out from the plastic material, which allows the air molecules to pass through. In this connection, there is the danger of the pressure sensor chip, which is designed for low pressure measurement ranges, being damaged by the high pressure for displacing the residual air in the housing.

For the pressure sensor chip, further steps are required to improve the electromagnetic compatibility, by means of capacitors, for example. The integration of these capacitors into the housing in the known sensor module is complicated and increases the manufacturing costs for the pressure sensor module.

JP 2000 009 568 A1 has disclosed a pressure sensor module in which an adapter is connected to a pressure sensor cell in order to determine the pressure of a fluid. The design is very complex and includes a large dead volume of the transmitting medium.

JP 11 316 166 A1, DE 44 15 984 A1, and U.S. Pat. No. 5,629,538 have disclosed pressure sensor chips, which have a protective film on the sensor membrane in order to protect it from a corrosive environment. This protective layer changes the reaction behavior and measurement behavior of the membrane in a negative fashion and also does not offer sufficient protection over a long time since this protective layer must be thin enough to allow the sensor membrane to continue to flex in a favorable fashion.

JP 81 36 380 A1 has disclosed a pressure sensor module, which is connected to an adapter in order to protect the pressure sensor chip from the corrosive medium. In this design, an O-ring must once again be used to produce a seal, which brings about the O-ring-related problems described above.

SUMMARY OF THE INVENTION

The pressure sensor module according to the invention has the advantage over the prior art that a pressure sensor module can be simply produced inexpensively and with a high degree of measurement precision for use in a corrosive environment. The high precision Is achieved by sharply reducing the oil volume. As a result, In the pressure sensor module according to the invention, the influence of the thermal expansion of the oil volume on the measurement signal is very low. As a result, a rapid calibration of the pressure sensor chip, which Is built into the sensor cell, can be executed in order to avoid the complex and long temperature steps in the finished pressure sensor module. A balancing of the sensor coils reduces the rejection costs in the calibration of the pressure sensor module. Since the sensor cell is smaller than the pressure sensor module, several sensor cells can be calibrated at the same time.

With one embodiment of advantageous adapter of the pressure sensor module, the adapter has a hole through it, which is connected at one end to a pressure fitting of the sensor cell and at the other end, is closed by means of a separating membrane; the volume thus enclosed is advantageously filled with a fluid. The adapter has a simple design and is therefore inexpensive.

It is advantageous if the adapter has an additional opening through which the fluid can be introduced into the hole.

A printed circuit board, for example with components on it, can advantageously be connected to external electrical connections of the pressure sensor chip of the sensor cell. This allows additional components for improving the electromagnetic compatibility to advantageously be mounted onto the printed circuit board.

The pressure sensor module housing can advantageously contain the electrical plug connections.

BRIEF DESCRIPTION OF THE DRAWINGS

Exemplary embodiments of the invention are shown in a simplified fashion in the drawings and will be explained in detail in the subsequent description.

FIG. 3 shows an axial cross section through an adapter, FIG. 6 shows an axial cross section through another pressure sensor module embodied according to the invention.

DETAILED DESCRIPTION OF THE PREFERRED EMBODIMENTS

Figure 1:
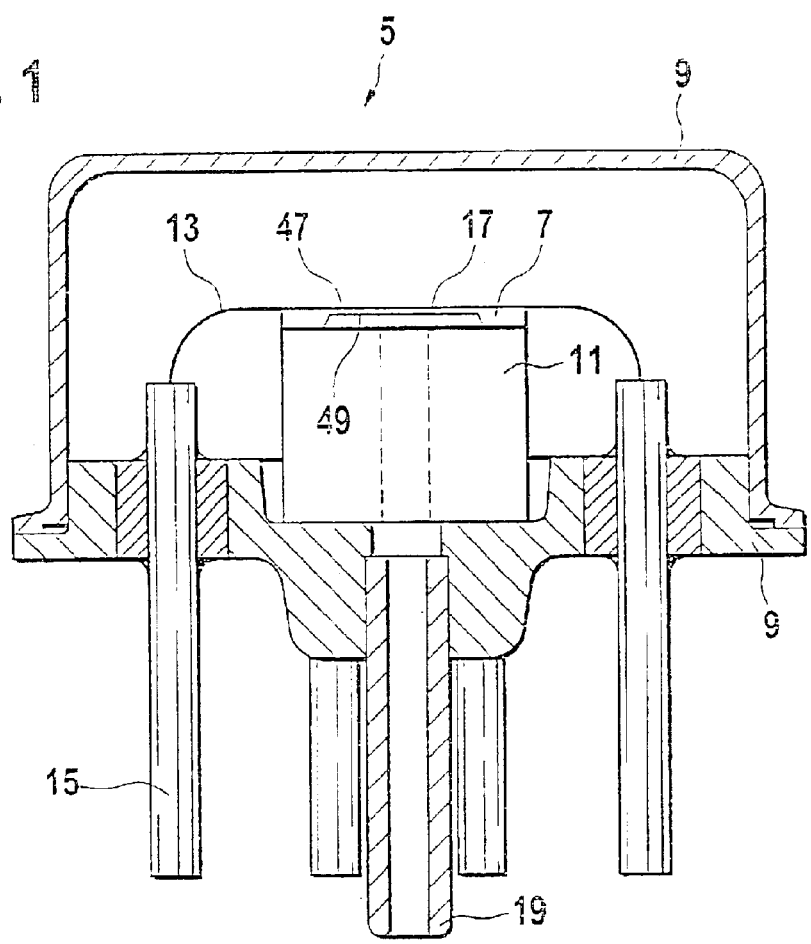
FIG. 1 shows an axial cross section through a sensor cell with a pressure sensor chip according to the prior art.

FIG. 1 shows an axial cross section through a sensor cell 5, which contains a pressure sensor chip 7 and is used for example in the pressure sensor module 1 according to the invention (FIG. 5). The pressure sensor chip 7 is mounted on a glass support 11, for example by means of anodic bonds. The sensor cell 5 has a for example two-piece sensor housing 9 in which the glass support 11 is affixed by means of a soldering process. Inside the sensor housing 9, bonding wires 13 electrically connect the pressure sensor chip 7 to electrical sensor connection elements 15, which protrude through the sensor housing 9. For example, the pressure sensor chip 7 has a membrane 17, whose underside 49 is acted on by a medium, which is conveyed by means of a pressure fitting 19, for example an additional metal tube, which is shown with dashed lines. The membrane 17 can flex as a result of a pressure acting on it so that the deflection results in a measurement signal that is transmitted by means of the bonding wires 13. A different pressure sensor chip 7 can also be used for the sensor cell 5.

For example, a vacuum prevails inside the sensor housing 9 so that the sensor cell 5 can be used for absolute pressure measurement.

The membrane 17 has a top side 47, which is disposed in approximately the same plane as the top of the pressure sensor chip 7. The bonding wires 13 are attached to this top side 47 of the pressure sensor chip 7. The membrane 17 also has an underside 49, opposite from the top side of the membrane.

Figure 2:
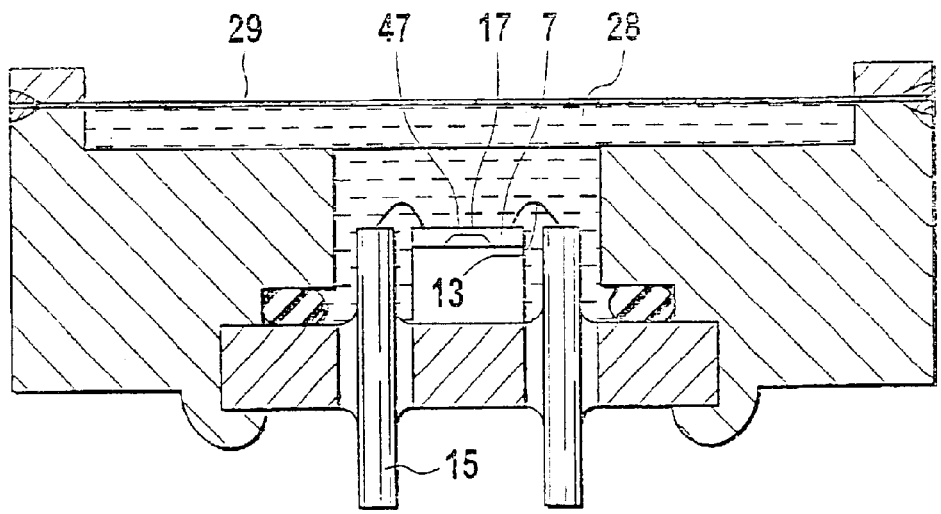
FIG. 2 shows a cross section through a pressure sensor module according to the prior art.

FIG. 2 shows a pressure sensor module according to the prior art.

In a pressure sensor module of this kind, a fluid 28 serving as a pressure-transmitting medium is disposed on the membrane top side 47 of the pressure sensor chip 7, which is also where the electrical contacting with the bonding wires 13 takes place. A separating membrane 29 encloses the fluid 28 so that the pressure sensor chip 7 is protected from corrosive mediums in this case as well. The volume for the pressure-transmitting medium 28, however, is relatively large because it encompasses the entire surface of the pressure sensor chip 7 and the sensor connection elements 15. Furthermore, there must be a certain distance from the separating membrane 29 to the pressure sensor chip 7 so that the separating membrane 29 cannot touch the bonding wires 13 or the pressure sensor chip 7. In particular, this large volume of the pressure-transmitting medium 28 results in the difficulties mentioned above.

FIG. 3 shows an axial cross section through an adapter 21, which is embodied, for example, in the shape of a cylinder with a hole 23 passing through the center. On a sensor end 25, the adapter 21 is connected to the pressure fitting 19 of the sensor cell 5 (FIG. 5). On the opposite end, a medium end 27, a separating membrane 29 closes the hole 23. There is a small distance between the separating membrane 29 and the medium end 27.

Lateral to the hole 23, the adapter 21 has a filling opening 31 and a filling hole 32 through which a fluid can be introduced into the hole 23 when the adapter 21 is assembled with the sensor cell 5. The volume of the hole 23 and of the filling hole 32 is deliberately selected as small in order to minimize an influence of the fluid on the measurement behavior of the pressure sensor chip 7. The fluid that is introduced into the hole 23 and the filling hole 32 serves to transmit a pressure, which is exerted against the separating membrane 29, to the membrane 17. Preferably, a silicon oil is used for this fluid. After being filled with oil, the filling hole 32 is tightly closed, for example by having a metal ball press-fitted into it. On its outer surface, the adapter 21 has a sealing ring 33, which seals the adapter 21 in relation to an opening or a receptacle that contains the medium to be measured.

Figure 4A:
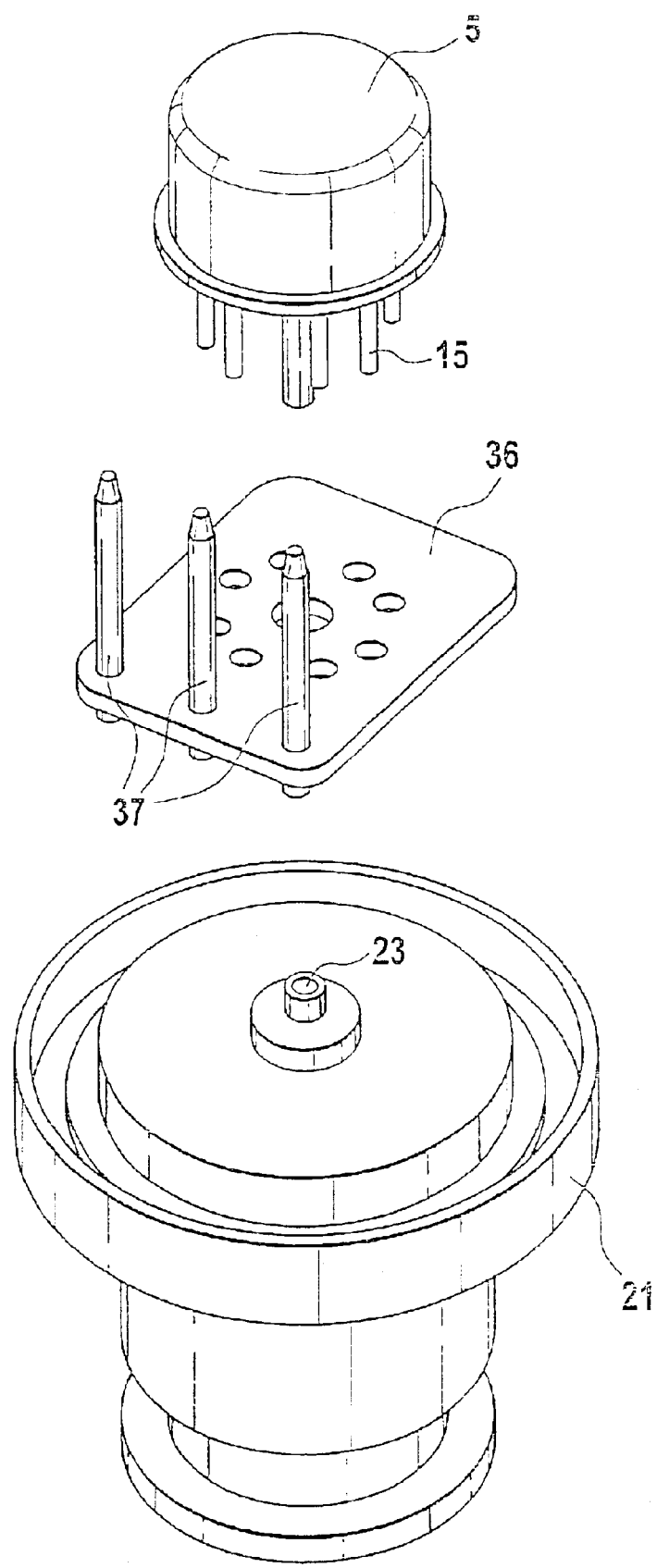
FIG. 4a shows a sensor cell with a printed circuit board and electrical connections and with an adapter, in the disassembled state.

FIG. 4a shows the sequence in which the sensor cell 5 is assembled with the adapter 21 and a printed circuit board 36. The printed circuit board 36 is disposed, for example, between the sensor cell 5 and the adapter 21, and is electrically connected, for example, to at least one contact pin 37, which is in turn connected, for example, to plug connections 39 (FIG. 5).

Figure 4B:
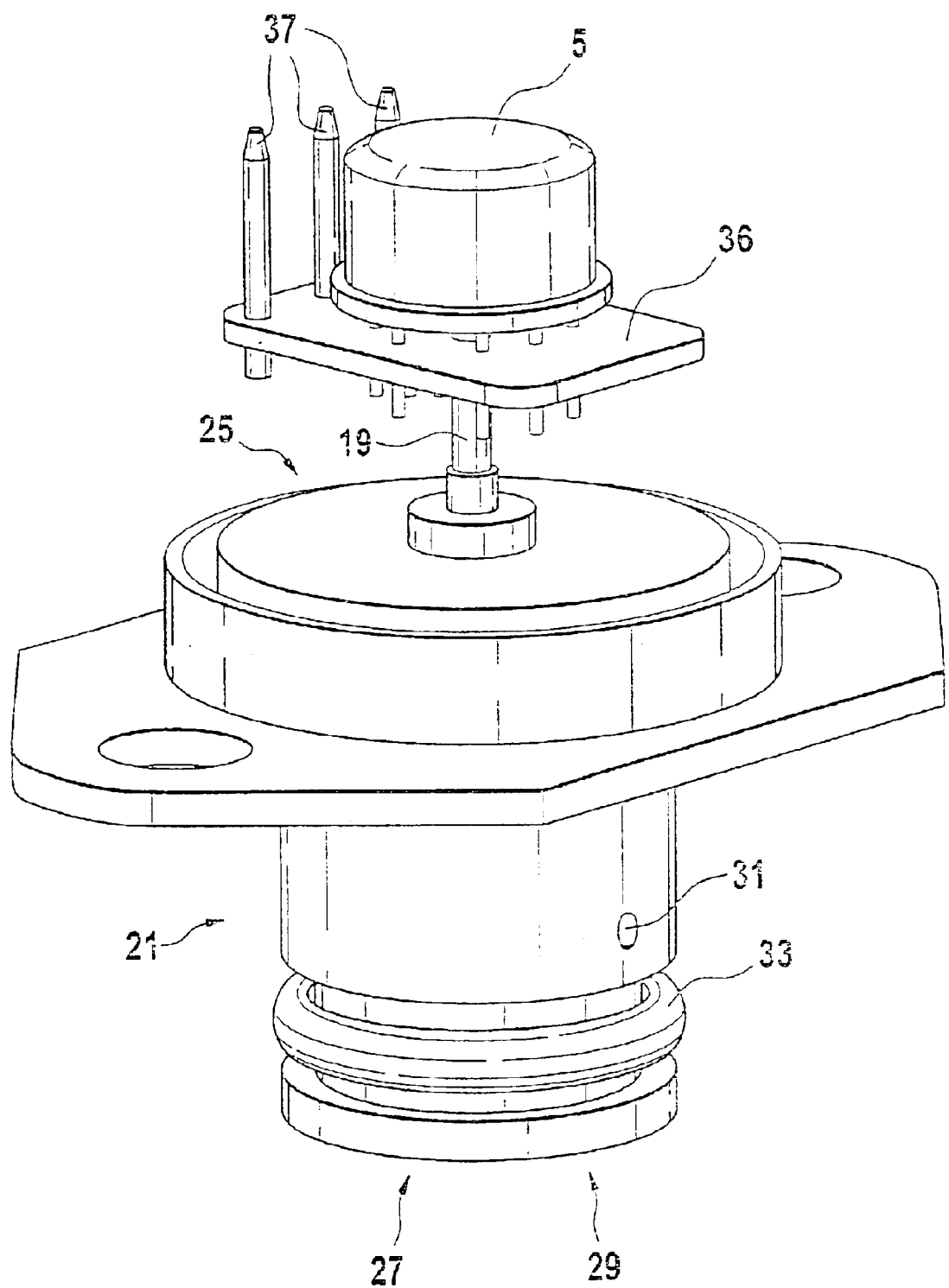
FIG. 4b shows the components in FIG. 4a when they are assembled.

FIG. 4b shows the components in FIG. 4a when they are assembled. The pressure fitting 19 is tightly connected to the hole 23 at the sensor end 25 of the adapter 21. The adapter 21 protects the membrane 17 from a corrosive medium. The printed circuit board 36 is connected in an electrically conductive fashion to the sensor connection elements 15 of the sensor cell 5 and is electrically connected to the contact pins 37, for example by means of lines on the printed circuit board 36, or is connected for example directly to plug connections 39 (FIG. 5c) so that an external plug connector 43 (FIG. 5a, b, c) produces an electrical connection of the sensor cell 5 with the outside. The printed circuit board 36 is not a required component of the pressure sensor module 1 according to the invention. In lieu of the printed circuit board 36, for example, a pressed screen can also be used.

FIG. 5a shows a pressure sensor module 1 according to the invention, once again in the partially assembled state. The apparatus shown in FIG. 4b now has a pressure sensor module housing 45 mounted onto it and together with it, is connected to the adapter 21, for example in a mechanical fashion. The sensor cell 5 is held by the pressure sensor module housing 45, e.g. by means of glue between the sensor cell 5 and the housing 45.

For example, the plug connections 39 are injection molded into the housing 45 and secured there, for example. Furthermore, a part of the housing 45 with the plug connections 39 forms of plug connector 43 in which the plug connections 39 can be accessed from the outside.

For example, the printed circuit board 36 has at least one electrical component 41 disposed on it, which serves, for example, to improve the electromagnetic compatibility. For example, these components are capacitors.

FIG. 5b shows an axial cross section through a pressure sensor module 1 according to the invention.

The contact pins 37 are connected in an electrically conductive fashion to the plug connection elements 39, for example by being soldered at a contact point 57. The contact point 57 can be additionally protected from external corrosion by means of a gel or glue. The separating membrane 29, which is clamped continuously around its edge, flexes when an external pressure is exerted on it.

Figure 5C:
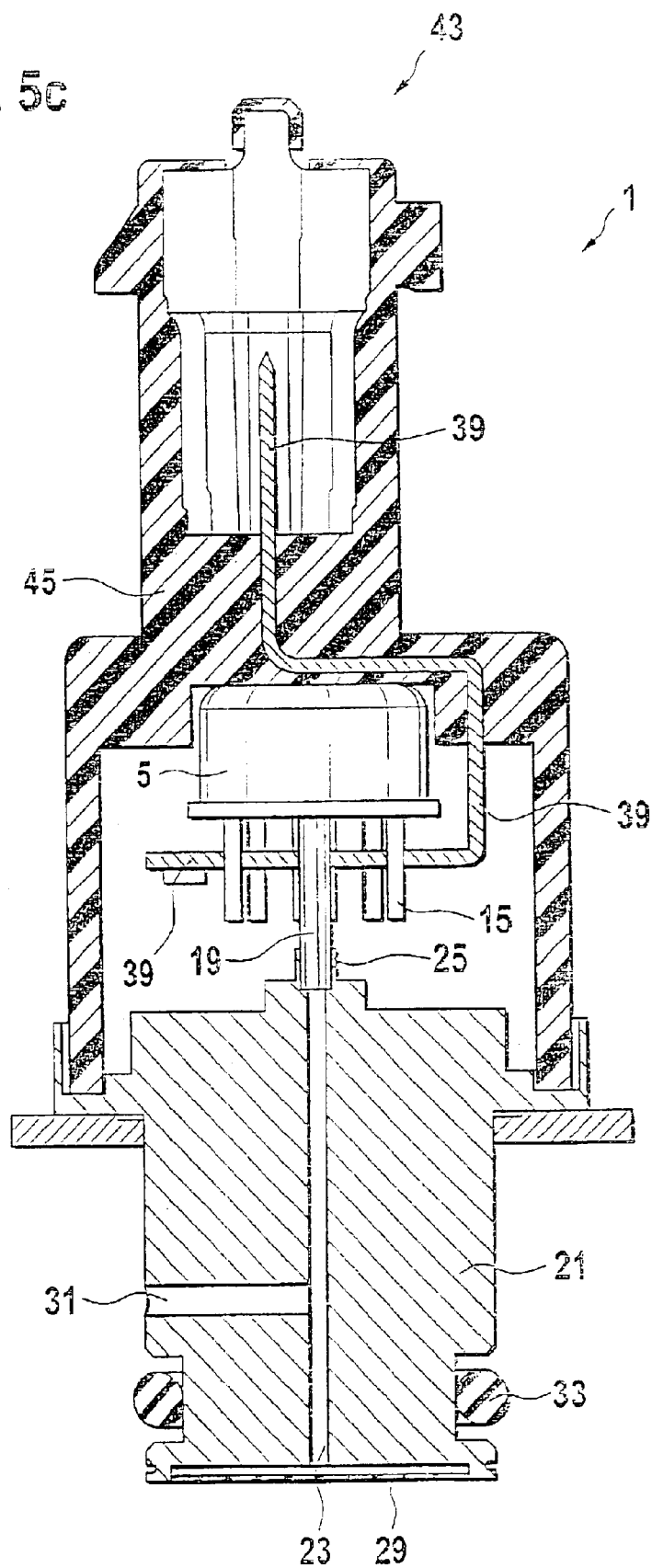
FIG. 5a shows an exemplary embodiment of a pressure sensor module embodied according to the invention, in the disassembled state.
FIG. 5b shows an axial cross section through an exemplary embodiment of a pressure sensor module according to the invention from FIG. 5a, FIG. 5c shows another exemplary embodiment of a pressure sensor module embodied according to the invention, without a printed circuit board.

FIG. 5c shows another exemplary embodiment of a pressure sensor module 1 according to the invention, without a printed circuit board 36. For example, a direct electrical contact has been provided between the plug connections 39 and the sensor contact elements 15. The housing 45 can, for example, be injection molded or cast around the sensor cell 5 and the plug connections 39.

The advantage of the pressure sensor module 1 according to the invention is comprised in that a commercially available sensor cell 5 can be used to measure a pressure of a corrosive medium.

The separating membrane 29 is embodied as flexible and transmits a pressure to the pressure sensor chip 7 by means of the fluid, which is contained in the volume between the separating membrane 29 and the membrane 17. The separating membrane 29 is comprised of a corrosive-resistant material.

Figure 6:
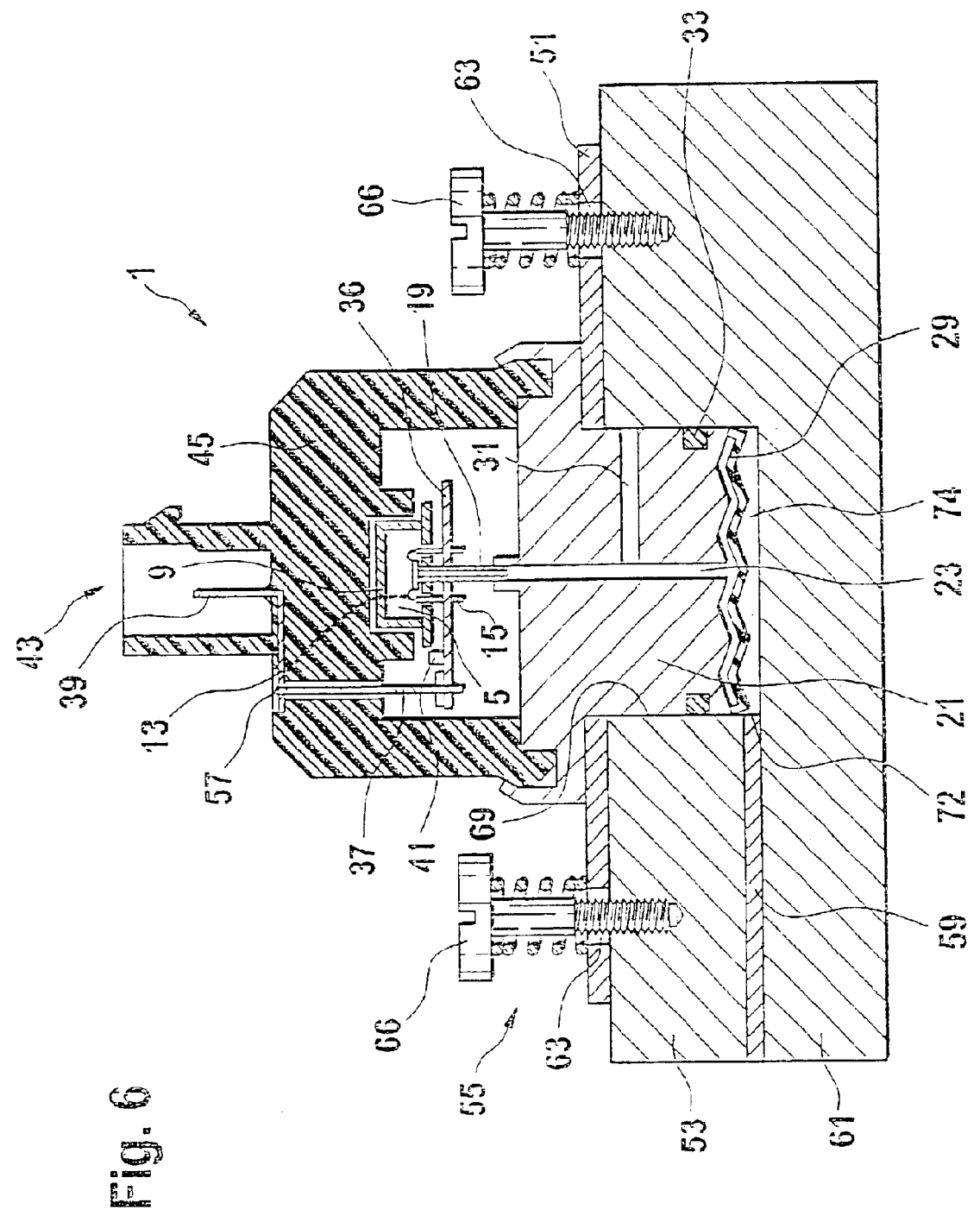

FIG. 6 shows an axial cross section through another pressure sensor module 1 according to the invention, which for example has a fastening flange 51, by means of which it is fastened for example to a wall 53. The pressure sensor module 1 is inserted into an insertion opening 69 of the wall 53. The wall 53 is part of a line 61, which a for example corrosive medium 59 flows through, or is part of a reservoir 61, which is used to store a corrosive medium 59.

The medium 59 can freeze and since it is in direct contact with the separating membrane 29, the expansion of the freezing medium 59, by means of the separating membrane 29, can cause the pressure on the membrane 17 to become so great that the membrane 17 breaks. In this connection, it makes sense to keep the volume of the medium 59 in the vicinity of the separating membrane 29 as low as possible in order to likewise keep the volume increase of the freezing medium 59 low. In order to avoid a membrane breakage, a homogeneous freezing is advantageous. This is achieved, for example, by means of a lateral pressure supply (72) and a uniform distance between the membrane 29 and the opposing blind hole bottom (74).

In addition, in order to avoid membrane breakage, the pressure sensor module 1 is fastened to the wall 53 in a flexible fashion. This is achieved, for example, in that the fastening flange 51 is embodied as flexible. For example, the fastening flange 51 is comprised of an elastic material, for example a spring steel, and it 51 is affixed in at least two fastening points 63 between which the fastening flange 51 can flex.

FIG. 6 shows another possibility. The pressure sensor module 1 is fastened to the wall 53 in a flexible fashion by means of a spring 55 and a T-piece 66, for example a screw 66. The screw 66 is inserted through an opening of the fastening flange 51 and is screwed into the wall 53. The spring 55 is disposed between the rigid fastening flange 51 and the screw 66. In this instance, the spring 55 engages the screw 66 and the fastening flange 51 so that the pressure sensor module 1 can be pushed out from the insertion opening 69 by exerting a force that compresses the spring 55.

The spring force of the spring 55 is set so that the spring 55 only flexes upon expansion of the freezing medium 59. The same is true of a fastening flange 51 that is embodied as flexible.

The sealing ring 33 is disposed just above the separating membrane 29 in the axial direction in order to reduce a friction between the adapter 21 and an inner wall of the wall 53 caused by the freezing medium.

It is not necessary to the function of the pressure sensor module 1 that the medium be corrosive.

What is claimed is:

1. A pressure senior module, comprised at least of a pressure sensor chip for detecting a pressure, wherein said pressure sensor chip is connected to a pressure fitting that conducts the pressure to the pressure sensor chip, wherein the pressure fitting (19) has an adapter (21) connected to it, wherein said adapter receives the pressure and transmits the pressure to the pressure sensor chip (7) by means of the pressure fitting (19), wherein said adapter protects the pressure sensor chip (7) from mediums that could damage the pressure sensor chip (7), wherein the pressure sensor module (1) is disposed in an Insertion opening (69) of a wall (53), wherein the pressure sensor module (1) has a separating membrane (29), wherein the wall (53) encloses a medium (59), wherein said medium is in contact with the separating membrane (9), and wherein the pressure sensor module (1) can be moved partway out from the insertion opening (69) when the medium (59) freezes and expands.

2. The pressure sensor module according to claim 1, wherein the adapter (21) has a hole (23) passing through it, wherein said hole is connected at a sensor end (25) to the pressure fitting (19) and at a medium end (27), the hole is closed by means of a separating membrane (29).

3. The pressure sensor module according to claim 2, wherein the pressure fitting (19), the hole (23), and a filling hole (32) of the adapter (21) are filled with a fluid.

4. The pressure sensor module according to claim 1, wherein the pressure sensor chip (7) has a top side (47) to which bonding wires (13) are electrically connected, and wherein an underside (49) of the pressure sensor chip (7) is connected to the pressure fitting (19).

5. The pressure sensor module according to claim 2, wherein the adapter (21) has a filling hole (32), wherein the filling hole is connected to the hole (23) and is used for the introduction of a fluid.

6. The pressure sensor module according to claim 1, wherein the pressure sensor chip (7) is disposed in a sensor cell (5), wherein the sensor cell has external electrical sensor connection elements (15) and wherein a printed circuit board (36) is electrically connected to the sensor connection elements (15).

7. The pressure sensor module according to claim 6, wherein the printed circuit board (36) is electrically connected to electrical plug connections (39), wherein the pressure sensor module (1) has a pressure sensor module housing (45), and wherein the electrical plug connections (39), together with the pressure sensor module housing (45), comprise a plug connector (43).

8. The pressure sensor module according to claim 1, wherein the pressure sensor chip (7) is connected to electrical plug connections (39), wherein the pressure sensor module (1) has a pressure sensor module housing (45), and wherein the electrical plug connections (39), together with the pressure sensor module housing (45), comprise a plug connector (43).

9. The pressure sensor module according to claim 1, wherein the pressure sensor chip (7) is disposed in a preassembled sensor cell (5), wherein said preassembled sensor cell has external electrical sensor connection elements (15).

10. The pressure sensor module according claim 1, wherein the pressure sensor chip (7) has a membrane (17), wherein said membrane generates a pressure-dependent measurement signal.

11. The pressure sensor module according to claim 7, wherein the pressure sensor module (1) has an adapter (21) and wherein the pressure sensor module housing (45) is connected to the adapter (21).

12. The pressure sensor module according to claim 1, wherein the pressure sensor module (1) is disposed on a fastening flange (51), wherein said fastening flange is embodied as flexible so that at least part of the fastening flange (51) can be moved in relation to the wail (53) and the pressure sensor module (1) can be moved partway out from the insertion opening (69).

13. The pressure sensor module according to claim 1, wherein the pressure sensor module (1) is disposed on a fastening flange (51), wherein said fastening flange engages a spring (55) so that the fastening flange (51) can be moved in relation to the wall (53) when a particular force acts on the spring (55) so that the pressure sensor module (1) can be moved partway out from the insertion opening (69).

* * * * *